US008750048B2

(12) United States Patent
Cho et al.

(10) Patent No.: US 8,750,048 B2
(45) Date of Patent: Jun. 10, 2014

(54) MEMORY DEVICE AND METHOD FOR OPERATING THE SAME

(75) Inventors: Myung Cho, Gyeonggi-do (KR); Seong-Je Park, Gyeonggi-do (KR); Jung-Hwan Lee, Gyeonggi-do (KR); Ji-Hwan Kim, Gyeonggi-do (KR); Beom-Seok Hah, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 307 days.

(21) Appl. No.: 13/238,435

(22) Filed: Sep. 21, 2011

(65) Prior Publication Data
US 2012/0269010 A1    Oct. 25, 2012

(30) Foreign Application Priority Data

Apr. 21, 2011    (KR) .......................... 10-2011-0037181

(51) Int. Cl.
*G11C 16/34* (2006.01)
*G11C 16/28* (2006.01)
*G11C 16/06* (2006.01)
*G11C 16/26* (2006.01)

(52) U.S. Cl.
USPC .............. 365/185.21; 365/185.17; 365/185.2; 365/185.08; 365/189.07; 365/207; 365/185.09

(58) Field of Classification Search
USPC ............... 365/185.08, 185.17, 185.2, 185.21, 365/189.07, 207, 185.09
See application file for complete search history.

(56) References Cited

U.S. PATENT DOCUMENTS

| 2004/0170056 A1* | 9/2004 | Shibata et al. ............ 365/185.03 |
| 2006/0004952 A1* | 1/2006 | Lasser ........................... 711/103 |
| 2007/0291536 A1* | 12/2007 | Kang ........................ 365/185.2 |

FOREIGN PATENT DOCUMENTS

JP        2004015434 A   *  1/2004

OTHER PUBLICATIONS

A michine translation of JP 2004-015434 (see Reference N above).*

* cited by examiner

*Primary Examiner* — J. H. Hur
(74) *Attorney, Agent, or Firm* — IP & T Group LLP

(57) ABSTRACT

A memory includes at least one first flag cell configured to store first flag data, at least one second flag cell configured to store second flag data, at least one first sensing node having a voltage level determined by the first flag data of the first flag cell, at least one second sensing having a voltage level determined by the second flag data of the second flag cell, a selection circuit configured to select the first sensing node or the second sensing node in response to a flag address; and a determination circuit having an internal node through which current corresponding to a voltage level of a selected sensing node flows and configured to determine a logic value of flag data corresponding to the selected sensing node among the first and second flag data by using an amount of current flowing through the internal node.

4 Claims, 4 Drawing Sheets

MEMORY DEVICE AND METHOD FOR OPERATING THE SAME

CROSS-REFERENCE TO RELATED APPLICATIONS

The present application claims priority of Korean Patent Application No. 10-2011-0037181, filed on Apr. 21, 2011, which is incorporated herein by reference in its entirety.

BACKGROUND

1. Field

Exemplary embodiments of the present invention relate to a memory.

2. Description of the Related Art

There has been an increased demand for a nonvolatile memory apparatus, which can be electrically programmed and erased without a refresh function rewriting data every predetermined cycle.

A nonvolatile memory includes a memory cell array for storing data. The memory cell array is constituted by a plurality of memory blocks each having a plurality of pages. Each page includes a number of memory cells. The threshold voltage distribution of each memory cell varies with the data stored therein. A nonvolatile memory device performs an erase operation on the basis of a memory block and performs a write or read operation on the basis of a page.

In a nonvolatile memory system, in order to increase the degree of integration of a memory region, a memory cell has been developed from a single level cell (SLC) to a multi-level cell (MLC). A memory cell for storing 1-bit data is called an SLC, and a memory cell for storing data of 2 or more bits is called an MLC. The SLC may have an erased state and a programmed state depending upon a threshold voltage level. The MLC may have an erased state and a plurality of programmed states depending upon a threshold voltage level.

A procedure for programming the MLC is more complicated than a procedure for programming the SLC. In this regard, data indicating a programmed state of the MLC is called flag data, and a memory cell for storing the flag data is called a flag cell. For example, the flag data may indicate whether or not the most significant bit (MSB) of data is programmed in an MLC. If the MSB of the data is stored in the MLC, the flag date may become a programmed state of '0', and otherwise it may become an erased state of '1'.

In order to secure the reliability of flag data, a majority check is used when determining the logic value of the flag data. That is, the same flag data is stored in a plurality of flag cells, and the logic value of the flag data is determined based on the majority number of values of the flag data read from the flag cells. The flag data may not be properly stored by errors occurring in a flag cell or a program operation. That is to say, in the case that the flag data is stored in only one flag cell, the logic value of the flag data may be erroneously determined, which is prevented by performing the majority check. For example, when reading the data from the plurality of flag cells, if the number of data of '0' is greater than '1' the logic value of the flag data is determined as '0' and otherwise it is determined as '1'.

The majority check may be performed by a method using a current sensing circuit (CSC) (hereinafter, referred to as a current sensing method). This current sensing method will be described below in detail.

First, flag data stored in a plurality of flag cells is read out. Next, an amount of current flowing through the input terminal of a current sensing circuit is determined depending upon the number of bits of '0' (or the number of bits of '1') among the values read out. Finally, the magnitudes of current flowing through the input terminal of the current sensing circuit and reference current are compared with each other, and it is determined whether the logic value of the flag data is '0' or '1'.

As the amount of data stored in a memory cell (an MLC) is extended from 2 bits to 3 bits and flag information which is to be stored regarding the programmed state of the memory cell increases, the bit number of flag data has been increased. For example, in order to indicate the programmed state of a memory cell capable of storing 3-bit data, flag data of 2 bits or more may be used (for example, first flag data is used to indicate whether or not second bit data is programmed and second flag data is used to indicate whether or not third bit data is programmed). Besides, there may be flag data for indicating whether or not a program pulse is additionally applied to narrow the distribution width of threshold voltages, flag data for storing the number of times of applying a program pulse in programming the least significant bit (LSB) of data so as to optimize the application times of the program pulse, and so forth.

In order to perform a majority check for respective bits of the flag data as the bit number of the flag data increases as described above, the current sensing circuit is to include input terminals which correspond to the respective bits of the flag data. If the number of input terminals of the current sensing circuit increases, the area for the current sensing circuit may increase and the layout thereof may become complicated.

SUMMARY

An embodiment of the present invention is directed to a memory device which can perform a majority check for each bit of multi-bit flag data by using a current sensing circuit and minimize the number of input terminals of the current sensing circuit.

In accordance with an embodiment of the present invention, a memory includes: at least one first flag cell configured to store first flag data; at least one second flag cell configured to store second flag data; at least one first sensing node having a voltage level determined by the first flag data of the first flag cell; at least one second sensing having a voltage level determined by the second flag data of the second flag cell; a selection circuit configured to select the first sensing node or the second sensing node in response to a flag address; and a determination circuit having an internal node through which current corresponding to a voltage level of a selected sensing node flows, wherein the determination circuit is configured to determine a logic value of flag data corresponding to the selected sensing node among the first and second flag data by using an amount of current flowing through the internal node.

In accordance with another embodiment of the present invention, a memory includes: first flag cells configured to store first flag data; second flag cells configured to store second flag data; third flag cells configured to store third flag data; first sensing nodes of which voltage levels are determined by the first flag data of the first flag cells, respectively; second sensing nodes of which voltage levels are determined by the second flag data of the second flag cells, respectively; third sensing nodes of which voltage levels are determined by the third flag data of the third flag cells, respectively; a selection circuit configured to select the first sensing nodes or the second sensing nodes in response to a flag address; and a determination circuit having a first internal node through which current corresponding to voltage levels of selected sensing nodes flows and a second internal node through which current corresponding to the voltage levels of the third sensing nodes flows, wherein the determination circuit is configured to determine a logic value of flag data corresponding to the selected sensing nodes among the first and second flag data by using the amount of current flowing through the first internal node and determine a logic value of the third flag data by using the amount of current flowing through the second internal node.

In accordance with yet another embodiment of the present invention, a method for operating a memory including at least one first flag cell for storing first flag data and at least one second flag cell for storing second flag data includes: selecting the first flag cell or the second flag cell in response to a flag address; generating current corresponding to a value stored in a selected flag cell; and comparing an amount of generated current with a reference current amount and determining a logic value of flag data stored in the selected flag cell.

In accordance with yet another embodiment of the present invention, a memory includes: a plurality of memory cells configured to store multi-bit data; a plurality of flag cell regions, each flag cell region comprising a plurality of flag cells, configured to store flag data, the flag data indicating that a certain bit of the multi-bit data is programmed to the plurality of memory cells; a plurality of sensing node groups each comprising sensing nodes corresponding to the flag cells and having a voltage level determined by the corresponding flag data; and a determination circuit having current paths corresponding to the sensing node groups, wherein each current path is formed in response to a voltage level of the corresponding sensing node group, when the corresponding sensing node group is selected, wherein the determination circuit is configured to determine a logic value of flag data corresponding to the selected sensing node group by using an amount of current flowing through the corresponding current path.

DETAILED DESCRIPTION

Figure 1:
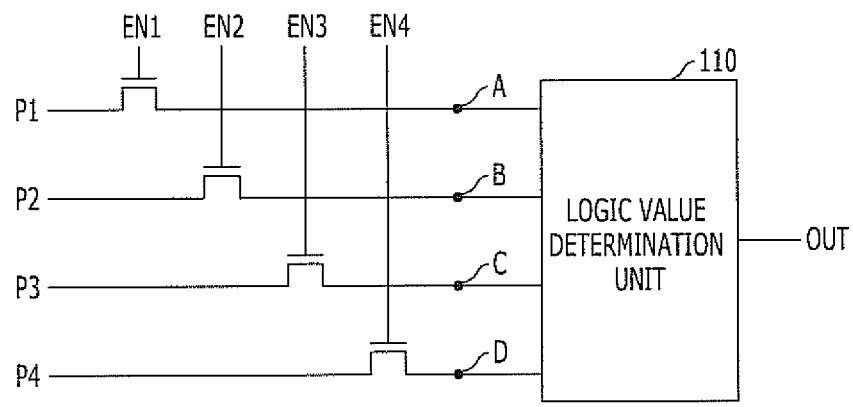
FIG. 1 is a diagram showing a scheme for performing a majority check for multi-bit flag data by using a current sensing method.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram showing a logic value determination unit (corresponding to a current sensing circuit) which is used in a current sensing method for multi-bit flag data.

In FIG. 1, a logic value determination unit 110 has four input terminals A to D. The respective four input terminals A to D correspond to first to fourth current paths P1 to P4. The respective first to fourth current paths P1 to P4 correspond to first to fourth enable signals EN1 to EN4. The logic value determination unit 110 compares current flowing through a current path, which corresponds to an enable signal activated among the first to fourth enable signals EN1 to EN4, with reference current generated inside the logic value determination unit 110. Depending upon a comparison result, the logic value of an output signal OUT is determined. The logic value determination unit 110 corresponds to a current sensing circuit (CSC).

Each of the first to fourth current paths P1 to P4 serves as a current path for performing a majority check for 1 bit of flag data. Since the logic value determination unit 110 shown in FIG. 1 includes the four input terminals A to D, a majority check may be performed for 4 bits of flag data. As above-described above in detail, in general, in order to perform a majority check for 1 bit of flag data, one current path and one input terminal of the logic value determination unit 110, which corresponds to the current path, are used. Accordingly, as the bit number of flag data increases, the number of input terminals of the logic value determination unit 110 increases, a circuit and its layout become complicated.

Figure 2:
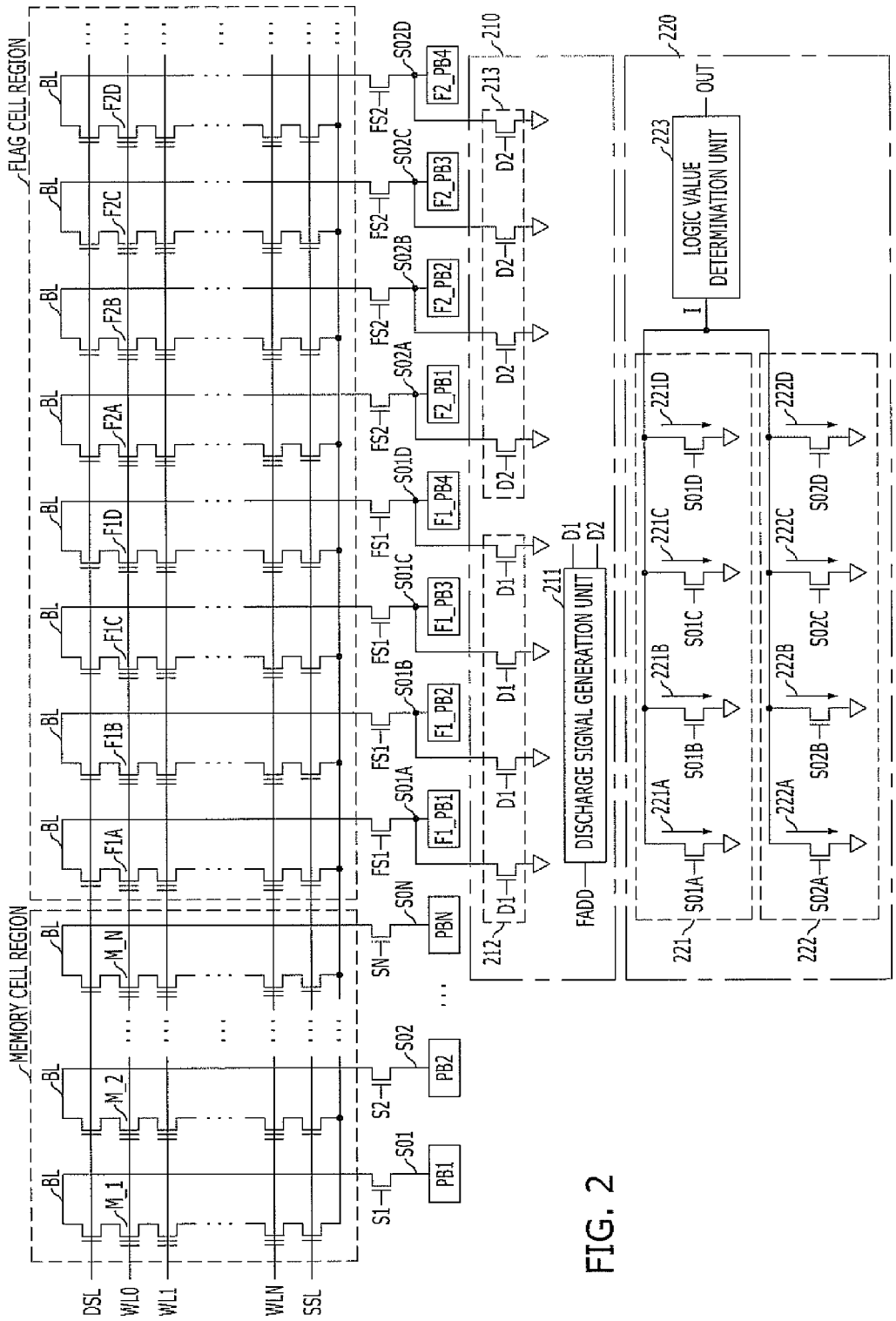
FIG. 2 is a circuit diagram showing the configuration of a memory device in accordance with an embodiment of the present invention.

FIG. 2 is a circuit diagram showing the configuration of a memory in accordance with an embodiment of the present invention.

Referring to FIG. 2, a memory includes one or more first flag cells F1A to F1D configured to store first flag data, one or more second flag cells F2A to F2D configured to store second flag data, one or more first sensing nodes S01A to S01D having the voltage level determined by the value stored in corresponding one among the one or more first flag cells F1A to F1D, one or more second sensing nodes S02A to S02D having the voltage level determined by the value stored in a corresponding one of the one or more second flag cells F2A to F2D, a selection circuit 210 configured to select the one or more first sensing nodes S01A to S01D or the one or more second sensing nodes S02A to S02D in response to a flag address FADD, and a determination circuit 220 having an internal node I through which current corresponding to the voltage levels of selected sensing nodes flows and configured to determine the logic value of the flag data stored in flag cells corresponding to the selected sensing nodes by using an amount of current flowing through the internal node I. The memory further includes a plurality of memory cells M_1 to M_N, one or more first page buffers F1_PB1 to F1_PB4 configured to determine the voltage level of a corresponding one of the one or more first sensing nodes S01A to S01D in response to the value stored in a corresponding one of the one or more first flag cells F1A to F1D, and one or more second page buffers F2_PB1 to F2_PB4 configured to determine the voltage level of corresponding one among the one or more second sensing nodes S02A to S02D in response to the value stored in a corresponding one of the one or more second flag cells F2A to F2D.

Although the number of flag cells for storing 1-bit flag data is usually 8 (corresponding to 1 byte), for the sake of convenience in explanation, it is shown in FIG. 2 at the case in which the number of flag cells for storing 1-bit flag data is 4. The number of flag cells for storing 1-bit flag data may influence the reliability of the flag data but an operation according to the present invention may be performed regardless of the number of flag cells.

The structure of the memory will be briefly described before describing operations of the memory.

The plurality of memory cells M_1 to M_N and the one or more first and second flag cells F1A to F1D and F2A to F2D are respectively included in cell strings. The cell strings represent string structures in which cells are connected in series between source selection transistors (transistors coupled to a source selection line SSL and drain selection transistors (transistors coupled to a drain selection line DSL. Bit lines BL are connected to the source selection transistors. Various voltages are applied to the floating gates of the respective cells (memory cells and flag cells) included in the cell strings by a plurality of word lines WL0, WL1, . . . , WLN.

A plurality of page buffers PB1 to PBN are configured to determine the voltage of corresponding one among a plurality of sensing nodes S01 to S0N depending upon the values of data stored in corresponding cells among the plurality of memory cells M_1 to M_N. The transistors, which receive signals S1 to SN, FS1 and FS2, c electrically connect and disconnect the bit lines BL to and from the sensing nodes S01 to S0N, S01A to S01D and S02A to S02D depending on an operation of the memory.

Hereafter, operations of the memory will be described with reference to FIG. 2.

The present invention may be applied to a memory which includes flag cells for storing flag information for a plurality of memory cells included in the memory. As described above, the flag information may include information indicating which bit data is stored in memory cells.

For the sake of clearness in explanation of the invention, an exemplary operation of a NAND flash memory is described. All operations of the memory are described on the basis of operations for reading and writing data from and in one page included in the NAND flash memory.

The plurality of memory cells M_1 to M_N and the one or more first and second flag cells F1A to F1D and F2A to F2D may be included in one page. Accordingly, the first and second flag cells F1A to F1D and F2A to F2D store flag information for the plurality of memory cells M_1 to M_N included in the same page as them. The plurality of memory cells M_1 to M_N may be MLCs, and the first and second flag cells F1A to F1D and F2A to F2D may be SLCs.

Hereinbelow, descriptions will be given for the case in which data of 3 bits (which are divided into a first bit, a second bit and a third bit having upper bits in those order) may be stored in the plurality of memory cells M_1 to M_N, the first flag data indicates that the second bit is programmed to the plurality of memory cells M_1 to M_N, and the second flag data indicates that the third bit is programmed to the plurality of memory cells M_1 to M_N.

The operations of the memory according to the embodiment of the present invention will be described by being divided into (1) an operation for programming the plurality of memory cells M_1 to M_N and the first and second flag cells F1A to F1D and F2A to F2D and (2) an operation for reading out data of the first and second flag cells F1A to F1D and F2A to F2D.

(1) An operation for programming the plurality of memory cells M_1 to M_N and the first and second flag cells F1A to F1D and F2A to F2D In the case of programming the first bit of data in the plurality of memory cells M_1 to M_N, a program pulse for programming the first bit of the data is applied to the word line WL0. Whether or not the first bit of the data is programmed in the plurality of memory cells M_1 to M_N may not be included in flag information. Therefore, a high voltage is applied to the bit lines BL of cell strings in which the first and second flag cells F1A to F1D and F2A to F2D are included, such that the first and second flag cells F1A to F1D and F2A to F2D are not programmed by the applied program pulse (hereinafter, referred to as a programming inhibition state).

In the case of programming the second bit of the data in the plurality of memory cells M_1 to M_N, a program pulse for programming the second bit of the data is applied to the word line WL0. The first flag data indicating whether or not the second bit of the data is programmed in the plurality of memory cells M_1 to M_N is stored in the one or more first flag cells F1A to F1D. Accordingly, the one or more first flag cells F1A to F1D are programmed by the applied program pulse.

As a result of the programming, the one or more first flag cells F1A to F1D are converted from an erased state (in which '1' is usually stored) into a programmed state (in which '0' is usually stored). However, if some of the first flag cells are defective or the program pulse is not properly applied, some of the first flag cells may remain in the erased state.

Since whether or not the second bit of the data is programmed in the plurality of memory cells M_1 to M_N is not related with the second flag data, the one or more second flag cells F2A to F2D are maintained in the programming inhibition state.

Finally, in the case of programming the third bit of the data in the plurality of memory cells M_1 to M_N, a program pulse for programming the third bit of the data is applied to the word line WL0. The second flag data indicating whether or not the third bit of the data is programmed in the plurality of memory cells M_1 to M_N is stored in the one or more second flag cells F2A to F2D. Accordingly, the one or more second flag cells F2A to F2D are programmed by the applied program pulse. If properly programmed, the one or more second flag cells F2A to F2D are converted into a programmed state. The one or more first flag cells F1A to F1D are maintained in the programming inhibition state.

In these ways, the plurality of memory cells M_1 to M_N and the one or more first and second flag cells F1A to F1D and F2A to F2D are programmed. For reference, the page buffers PB1 to PBN, F1_PB1 to F1_PB4 and F2_PB1 to F2_PB4 control the bit lines BL for the cells to be in the programming inhibition state or a programmable state.

(2) An operation for reading out the data stored in the first and second flag cells F1A to F1D and F2A to F2D The memory reads out the values stored in one or more flag cells selected by the flag address FADD among the one or more first and second flag cells F1A to F1D and F2A to F2D, through the procedure described below. The flag address FADD is changed depending upon which flag data of the first flag data and the second flag data is to be verified.

If the procedure for reading out the data begins, first, the voltages of the one or more first sensing nodes S01A to S01D are determined by the values stored in the one or more first flag cells F1A to F1D, and the voltages of the one or more second sensing nodes S02A to S02D are determined by the values stored in the one or more second flag cells F2A to F2D.

For example, when the values stored in the flag cells F1A to F1D and F2A to F2D are '1', the voltages of the sensing nodes S01A to S01D and S02A to S02D become a low level, and when the values stored in the flag cells F1A to F1D and F2A to F2D are '0', the voltages of the sensing nodes S01A to S01D and S02A to S02D become a high level (hereinafter, description will be made using this example). The voltages of the sensing nodes S01A to S01D and S02A to S02D are determined in this way by the page buffers F1_PB1 to F1_PB4 and F2_PB1 to F2_PB4.

Next, the selection circuit 210 maintains the voltage levels of one or more sensing nodes, which are selected by the flag address FADD among the one or more first and second sensing nodes S01A to S01D and S02A to S02D, as it is and discharges the voltages of one or more sensing nodes which are not selected to a low level. The flag cells or page buffers corresponding to the selected sensing nodes may be selected by the flag address FADD. For example, in the case where the one or more first sensing nodes S01A to S01D are selected, the one or more first flag cells F1A to F1D and the one or more page buffers F1_PB1 to F1_PB4 are also selected.

For such an operation, the selection circuit 210 includes a discharge signal generation unit 211 configured to activate (to a high level) a first discharge signal D1 or a second discharge signal D2 in response to the flag address FADD, a first discharge unit 212 configured to discharge the one or more first sensing nodes S01A to S01D when the first discharge signal D1 is activated, and a second discharge unit 213 configured to discharge the one or more second sensing nodes S02A to S02D when the second discharge signal D2 is activated. Here, discharge means to make the voltage of sensing nodes have a low level.

The discharge signal generation unit 211 generates a discharge signal for discharging one or more sensing nodes which are not selected by the flag address FADD. The first discharge unit 212 includes one or more first transistors receiving the first discharge signal D1. If the first discharge signal D1 is activated, the first transistors are turned on and the one or more first sensing nodes S01A to S01D are discharged. The second discharge unit 213 includes one or more second transistors receiving the second discharge signal D2. If the second discharge signal D2 is activated, the second transistors are turned on and the one or more second sensing nodes S02A to S02D are discharged.

For example, when the one or more first flag cells F1A to F1D are selected by the flag address FADD, the discharge signal generation unit 211 deactivates the first discharge signal D1 and activates the second discharge signal D2 in response to the flag address FADD. In this case, since the first transistors are turned off, the voltages of the one or more first sensing nodes S01A to S01D are maintained as they are, and since the second transistors are turned on, the one or more second sensing nodes S02A to S02D are discharged.

The determination circuit 220 determines the logic value of the flag data stored in one or more flag cells corresponding to the one or more selected sensing nodes by using current of which amount is determined by the voltage levels of the one or more selected sensing nodes. The determined logic value of the flag data represents the voltage level of an output node OUT.

The determination circuit 220 includes one or more first current paths 221A to 221D configured to be activated or deactivated based on the voltage levels of a corresponding one of the one or more first sensing nodes S01A to S01D, one or more second current paths 222A to 222D configured to be activated or deactivated based on the voltage levels of a corresponding one of the one or more second sensing nodes S02A to S02D, the internal node I through which current corresponding to the activated number of current paths selected among the first and second current paths by the selection circuit 210 flows, and a logic value determination unit 223 configured to compare the amount of current flowing through the internal node I and a reference current amount and determine the logic value of the flag data stored in flag cells corresponding to the selected sensing nodes. Here, the activation of the current path means that a transistor composing the current path turns on, and the deactivation of the current path means that the transistors turns off.

The one or more first current paths 221A to 221D are activated, when the voltage level of corresponding one among the one or more first sensing nodes S01A to S01D is a high level, and are deactivated when the voltage level is a low level. The one or more second current paths 222A to 222D are activated, when the voltage level of a corresponding one of the one or more second sensing nodes S02A to S02D is a high level, and are deactivated when the voltage level is a low level.

One or more sensing nodes which are not selected by the flag address FADD are all discharged and become a low level. Therefore, current paths corresponding to one or more sensing nodes not selected by the flag address FADD among the one or more first current paths 221A to 221D and the one or more second current paths 222A to 222D are all deactivated. Conversely, the voltages of one or more sensing nodes selected by the flag address FADD are determined by the values stored in flag cells corresponding to them. As a result, the amount of current flowing through the internal node I is determined by the values stored in one or more flag cells corresponding to the one or more sensing nodes selected by the flag address FADD.

That is to say, in the case where the one or more first sensing nodes S01A to S01D are selected by the flag address FADD, the sum of the amounts of current flowing through activated paths among the one or more first current paths 221A to 221D flows through the internal node I. Also, in the case where the one or more second sensing nodes S02A to S02D are selected by the flag address FADD, the sum of the amounts of current flowing through activated paths among the one or more second current paths 222A to 222D flows through the internal node I.

The determination circuit 220 compares the amount of current flowing through the internal node I and the reference current amount and determines the logic value of the flag data stored in flag cells corresponding to the sensing nodes selected among the one or more first sensing nodes S01A to S01D and the one or more second sensing nodes S02A to S02D. Namely, by comparing the amount of current flowing through the internal node I and the reference current amount, the logic value of the flag data stored in the one or more flag cells selected by the flag address FADD is determined.

For example, when the one or more first sensing nodes S01A to S01D are selected, the amount of current flowing through the internal node I is determined by the voltage levels of the one or more first sensing nodes S01A to S01D. Accordingly, by comparing the current amount of the internal node I and the reference current amount, detected detection is made as to whether the number of first sensing nodes with a high voltage level among the one or more first sensing nodes S01A to S01D is greater or less than a specified number (a number preset by reference current). At this time, because all voltages of the second sensing nodes S02A to S02D have a low level (that is, are discharged), they may not influence the amount of current flowing through the internal node I. In the case that the one or more second sensing nodes S02A to S02D are selected, the above descriptions will be reversed.

The reference numeral 221 designates a unit configured to control the amount of current flowing through the internal node I in response to the voltages of the one or more first sensing nodes S01A to S01D, and the reference number 222 designates a unit configured to control the amount of current flowing through the internal node I in response to the voltages of the one or more second sensing nodes S02A to S02D.

The embodiment of the present invention is related with the operation of reading out the data stored in the one or more flag cells F1A to F1D and F2A to F2D, and it may not be directly related with a procedure for reading out the data stored in the plurality of memory cells M_1 to M_N. Since the procedure for reading out the data stored in the plurality of memory cells M_1 to M_N is well known to a person skilled in the art, detailed description thereof is omitted here.

In the embodiment of the present invention, even when only one input terminal is provided to the current sensing circuit (CSC) (corresponding to the logic value determination unit 223), a majority check for flag data of 2 or more bits may be performed. The reason to this is because one or more sensing nodes not selected by the flag address FADD are all discharged so as not to influence the amount of current flowing through the internal node I. As a consequence, while a plurality of check paths (each generating current for performing a majority check for 1-bit flag data) are connected to one input terminal of the current sensing circuit, because only one check path selected by the flag address FADED is activated among the plurality of check paths (current does not flow through the remaining check paths), a majority check may be performed for flag data corresponding to the activated check path.

For example, describing the memory shown in FIG. 2, the first current paths 221A to 221D and the second current paths 222A to 222D are electrically connected to the internal node I. The first current paths 221A to 221D serve as component elements for performing a majority check for the values stored in the first flag cells F1A to F1D and determine the logic value of the first flag data, and the second current paths 222A to 222D serve as component elements for performing a majority check for the values stored in the second flag cells F2A to F2D and determine the logic value of the second flag data. When the first sensing nodes S01A to S01D are selected by the flag address FADD, the second current paths 222A to 222D do not exert any influence on the amount of current flowing through the internal node I since the second sensing nodes S02A to S02D are discharged, and only the first current paths 221A to 221D exert an influence on the amount of current flowing through the internal node I, thereby determining the logic value of the first flag data.

Thus, in the embodiment of the present invention, since the number of input terminals of the current sensing circuit (corresponding to the logic value determination unit 223 shown in FIG. 2) may be decreased, the circuitry and the layout of the memory may be less complicated and the area of the memory may be reduced.

Figure 3:
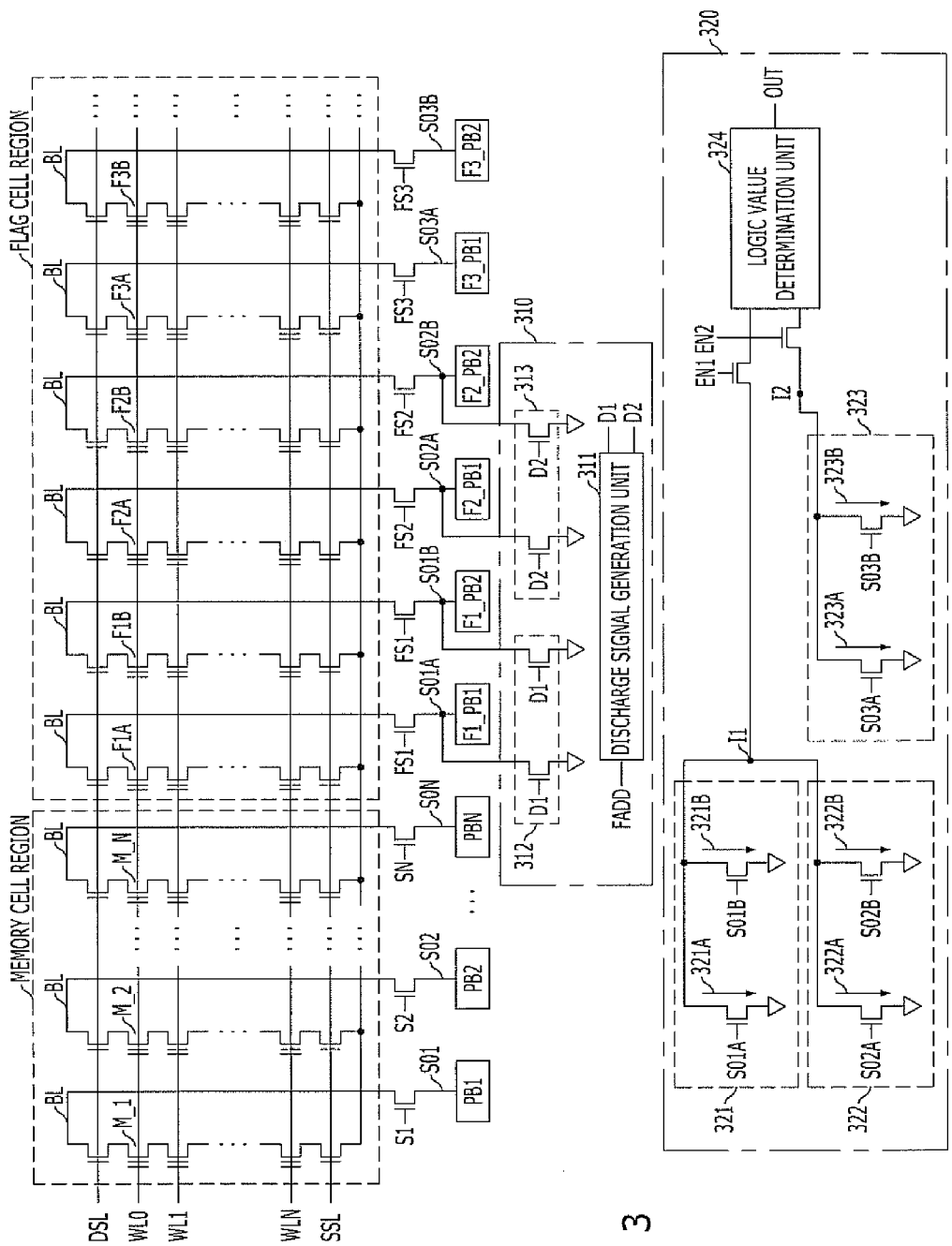
FIG. 3 is a circuit diagram showing the configuration of a memory device in accordance with another embodiment of the present invention.

FIG. 3 is a circuit diagram showing the configuration of a memory in accordance with another embodiment of the present invention.

FIG. 3 shows a memory which includes a current sensing circuit (CSC) (corresponding to a logic value determination unit 324) having one input terminal capable of performing a majority check for 2-bit flag data as shown in FIG. 2 and another input terminal capable of performing a majority check for 1-bit flag data.

Referring to FIG. 3, the memory includes one or more first flag cells F1A and F1B configured to store first flag data, one or more second flag cells F2A and F2B configured to store second flag data, one or more third flag cells F3A and F3B configured to store third flag data, one or more first sensing nodes S01A and S01B having the voltage level determined by the value stored in corresponding one among the one or more first flag cells F1A and F1B, one or more second sensing nodes S02A and S02B having the voltage level determined by the value stored in corresponding one among the one or more second flag cells F2A and F2B, one or more third sensing nodes S03A and S03B having the voltage level determined by the value stored in corresponding one among the one or more third flag cells F3A and F3B, a selection circuit 310 configured to select the one or more first sensing nodes S01A and S01B or the one or more second sensing nodes S02A and S02B in response to a flag address FADD, and a determination circuit 320 having a first internal node I1 through which current corresponding to the voltage levels of selected sensing nodes flows and a second internal node I2 through which current corresponding to the voltage levels of the one or more third sensing nodes flows and configured to determine the logic value of the flag data stored in flag cells corresponding to the selected sensing nodes by using the amount of current flowing through the first internal node I1 and determine the logic value of the third flag data stored in the one or more third flag cells F3A and F3B by using the amount of current flowing through the second internal node I2. The memory further includes a plurality of memory cells M_1 to M_N, one or more first page buffers F1_PB1 and F1_PB2 configured to determine the voltage level of a corresponding one of the one or more first sensing nodes S01A and S01B in response to the value stored in a corresponding one of the one or more first flag cells F1A and F1B, one or more second page buffers F2_PB1 and F2_PB2 configured to determine the voltage level of a corresponding one of the one or more second sensing nodes S02A and S02B in response to the value stored in a corresponding one of the one or more second flag cells F2A and F2B, and one or more third page buffers F3_PB1 and F3_PB2 configured to determine the voltage level of a corresponding one of the one or more third sensing nodes S03A and S03B in response to the value stored in a corresponding one of the one or more third flag cells F3A and F3B.

The structure of the memory may be similar to that described with reference to FIG. 2. For the sake of convenience in explanation, FIG. 3 shows two flag cells for storing 1-bit flag data according to an example.

Hereafter, operations of the memory will be described with reference to FIG. 3.

In the memory shown in FIG. 3, the amount of current flowing through the first internal node I1 is determined by current paths corresponding to selected sensing nodes among the first and second current paths 321A, 321B, 322A and 322B, and the amount of current flowing through the second internal node I2 is determined by the third current paths 323A and 323B corresponding to the third sensing nodes S03A and S03B. The first internal node I1 may correspond to the internal node I shown in FIG. 2, and the first internal node I1 and the second internal node I2 may have the relationship between P1 and P2 in FIG. 1. The memory shown in FIG. 3 is different from the memory shown in FIG. 2 in that the logic value determination unit 324 has the two input terminals I1 and I2 which are physically separated from each other. Hereafter, operations of the memory shown in FIG. 3 will be described mainly for differences from the memory shown in FIG. 2.

The logic value determination unit 324 included in the determination circuit 320 determines the logic value of the first flag data or the second flag data in response to current flowing through the first internal node I1 when a first enable signal EN1 is activated and outputs the determined logic value to an output node OUT, and it determines the logic value of the third flag data in response to current flowing through the second internal node I2 when a second enable signal EN2 is activated and outputs the determined logic value to the output node OUT.

In the case that the first enable signal EN1 is activated and the first sensing nodes S01A and S01B are selected by the flag address FADD, the logic value determination unit 324 determines the logic value of the first flag data stored in the first flag cells F1A and F1B. In the case that the first enable signal EN1 is activated and the second sensing nodes S02A and S02B are selected by the flag address FADD, the logic value determination unit 324 determines the logic value of the second flag data stored in the second flag cells F2A and F2B.

In the case that the second enable signal EN2 is activated, the logic value determination unit 324 determines the logic value of the third flag data stored in the third flag cells F3A and F3B. For reference, in FIG. 3, the flag address FADD indicates which sensing nodes among the first sensing nodes S01A and S01B and the second sensing nodes S02A and S02B will be selected.

The operation for determining the amount of current flowing through the first internal node I1 is the same as the operation for determining the amount of current flowing through the internal node I in FIG. 2.

The selection circuit 310 includes a discharge signal generation unit 311 configured to activate (to a high level) a first discharge signal D1 or a second discharge signal D2 in response to the flag address FADD, a first discharge unit 312 configured to discharge the first sensing nodes S01A and S01B when the first discharge signal D1 is activated, and a second discharge unit 313 configured to discharge the second sensing nodes S02A and S02B when the second discharge signal D2 is activated. The configuration and operation of the selection circuit 310 are substantially the same as those of the selection circuit 210 described above with reference to FIG. 2.

The determination circuit 320 includes first current paths 321A and 321B configured to be activated or deactivated depending upon the voltage level of a corresponding one of the first sensing nodes S01A and S01B, second current paths 322A and 322B configured to be activated or deactivated depending upon the voltage level of a corresponding one of the second sensing nodes S02A and S02B, third current paths 323A and 323B configured to be activated or deactivated depending upon the voltage level of a corresponding one of the third sensing nodes S03A and S03B, the first internal node I1 through which current corresponding to the activated number of current paths selected among the first and second current paths by the selection circuit 310 flows when the first enable signal EN1 is activated, the second internal node I2 through which current corresponding to the number of current paths activated among the third current paths 323A and 323B flows when the second enable signal EN2 is activated, and the logic value determination unit 324 configured to compare the amount of current flowing through an internal node corresponding to an activated enable signal and a reference current amount and determine the logic value of flag data.

When the first enable signal EN 1 is activated, the operation of the determination circuit 320 is substantially the same as the operation of the determination circuit 220 described above with reference to FIG. 2. When the second enable signal EN2 is activated, the determination circuit 320 compares the amount of current flowing through the second internal node I2 with a reference current amount and determines the logic value of the third flag data.

As can be seen from FIG. 3, in the case that flag data is 3 bits or over, check paths for performing majority checks for some bits of the flag data may be connected with one input terminal of the current sensing circuit (CSC) (corresponding to the logic value determination unit 324), and check paths for performing majority checks for the remaining bits may be connected with other input terminals of the current sensing circuit, respectively. The substantially similar effects may be achieved in the memory devices shown in FIGS. 2 and 3.

Figure 4:
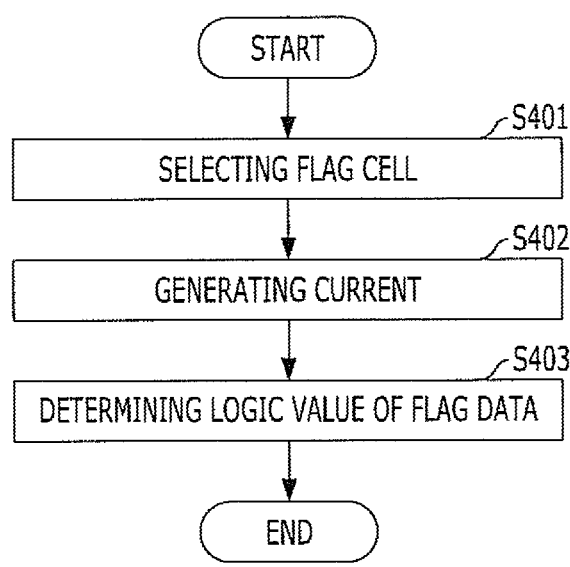
FIG. 4 is a flow chart explaining a method for operating a memory device in accordance with another embodiment of the present invention.

FIG. 4 is a flow chart explaining a method for operating a memory in accordance with another embodiment of the present invention. The memory operating method according to embodiment of the present invention will be described with reference to FIGS. 2 and 4 as follows.

Referring to FIG. 4, a method for operating a memory including one or more first flag cells F1A to F1D for storing first flag data of the memory and one or more second flag cells F2A to F2D for storing second flag data of the memory includes selecting the first flag cells F1A to F1D or the second flag cells F2A to F2D in response to a flag address FADD (S401), generating current corresponding to values stored in selected flag cells (S402), and comparing an amount of the generated current with a reference current amount and determining a logic value of flag data stored in the selected flag cells (S403).

The amount of current generated in the generating of the current (S402) depends on the values stored in the selected flag cells. For example, when the number of '1' is greater among the values stored in the selected flag cells, i.e., between the numbers of '1' and '0', the amount of current generated in the generating of the current (S402) decreases relatively, and when the number of '0' is greater among the values stored in the selected flag cells, the amount of current generated in the generating of the current (S402) increases relatively. According to another example, an opposite case where the current decreases may be used.

In the determining of the logic value of the flag data (S403), when the amount of current generated in the generating of the current (S402) is greater than the reference current amount, the logic value of the flag data stored in the flag cells corresponding to the selected sensing nodes is determined as '0', and when the amount of current generated in the generating of the current (S402) is less than the reference current amount, the logic value of the flag data stored in the flag cells corresponding to the selected sensing nodes is determined as '1'.

As is apparent from the above descriptions, the memory according to the embodiments of the present invention can perform a majority check for each bit of multi-bit flag data by using a current sensing circuit. In this regard, since an input terminal of the current sensing circuit is shared to perform the majority check for different bits, the complexity and area of the memory may be reduced.

While the present invention has been described with respect to the specific embodiments, it will be apparent to those skilled in the art that various changes and modifications may be made without departing from the spirit and scope of the invention as defined in the following claims.

What is claimed is:

1. A memory comprising:
   first flag cells configured to store first flag data;
   second flag cells configured to store second flag data;
   third flag cells configured to store third flag data;
   first sensing nodes having voltage levels determined by the first flag data of the first flag cells, respectively;
   second sensing nodes having voltage levels determined by the second flag data of the second flag cells, respectively;
   third sensing nodes having voltage levels determined by the third flag data of the third flag cells, respectively;
   a selection circuit configured to select the first sensing nodes or the second sensing nodes in response to a flag address; and
   a determination circuit having a first internal node through which current corresponding to voltage levels of the selected sensing nodes flows and a second internal node through which current corresponding to the voltage levels of the third sensing nodes flows, wherein the determination circuit is configured to determine a logic value of flag data corresponding to the selected sensing nodes among the first and second flag data by using the amount of current flowing through the first internal node and determine a logic value of the third flag data by using the amount of current flowing through the second internal node.

2. The memory of claim 1, wherein the selection circuit discharges sensing nodes other than the selected sensing node among the first sensing nodes and the second sensing nodes.

3. The memory of claim 1, wherein the determination circuit is configured to determine the logic value of the flag data corresponding to the sensing nodes by comparing the amount of current flowing through the first internal node with a reference current amount and determine the logic value of the third flag data by comparing the amount of current flowing through the second internal node with the reference current amount.

4. The memory of claim 1, further comprising:
first page buffers configured to determine the respective voltage levels of first sensing nodes in response to the first flag data of the first flag cells, respectively;
second page buffers configured to determine the respective voltage levels of second sensing nodes in response to the second flag data of the second flag cells, respectively; and
third page buffers configured to determine the respective voltage levels of third sensing nodes in response to the third flag data of the third flag cells, respectively.

* * * * *